US010147707B2

(12) United States Patent
Tonedachi

(10) Patent No.: US 10,147,707 B2
(45) Date of Patent: Dec. 4, 2018

(54) SEMICONDUCTOR DEVICE

(71) Applicant: KABUSHIKI KAISHA TOSHIBA, Tokyo (JP)

(72) Inventor: Tatsuo Tonedachi, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/687,378

(22) Filed: Aug. 25, 2017

(65) Prior Publication Data
US 2018/0240732 A1 Aug. 23, 2018

(30) Foreign Application Priority Data

Feb. 20, 2017 (JP) ................. 2017-029088

(51) Int. Cl.
*H01L 25/07* (2006.01)
*H01L 23/373* (2006.01)
(Continued)

(52) U.S. Cl.
CPC .......... *H01L 25/072* (2013.01); *H01L 23/057* (2013.01); *H01L 23/24* (2013.01); *H01L 23/3735* (2013.01); *H01L 24/29* (2013.01); *H01L 24/32* (2013.01); *H01L 24/45* (2013.01); *H01L 24/48* (2013.01); *H01L 24/73* (2013.01); *H01L 25/0655* (2013.01); *H01L 25/18* (2013.01); *H01L 2224/29239* (2013.01);
(Continued)

(58) Field of Classification Search
CPC ..... H01L 25/07–25/074; H01L 25/11–25/167; H01L 25/18; H01L 25/0655; H01L 2924/12032; H01L 2924/13055
See application file for complete search history.

(56) References Cited

U.S. PATENT DOCUMENTS 9,025,341 B2 * 5/2015 Kawanami ............ H01L 25/072
   361/783
9,165,871 B2 * 10/2015 Miyanagi ................ H01L 24/73
(Continued)

FOREIGN PATENT DOCUMENTS

JP   2741697 B2   4/1998
JP   3951400 B2   8/2007

*Primary Examiner* — Bac Au
(74) *Attorney, Agent, or Firm* — Patterson & Sheridan, LLP

(57) ABSTRACT

A semiconductor device includes a first and a second metal layer, the second provided on a same plane as the first layer, and first second and third terminals. A first metal wiring layer is electrically connected to the first terminal. A second metal wiring layer is electrically connected to the second terminal and the second metal layer and disposed over the first metal wiring layer. A third metal wiring layer is electrically connected to the third terminal and the first metal layer. A first semiconductor chip is provided between the first metal wiring layer and the first metal layer. A second semiconductor chip is provided between the third metal wiring layer and the second metal layer. The first chip has electrodes connected to the first metal wiring layer and the first metal layer. The second chip has electrodes connected to the third metal wiring layer and the second metal layer.

20 Claims, 7 Drawing Sheets

(51) Int. Cl.
  *H01L 23/24*   (2006.01)
  *H01L 23/00*   (2006.01)
  *H01L 25/18*   (2006.01)
  *H01L 23/057*  (2006.01)
  *H01L 25/065*  (2006.01)

(52) U.S. Cl.
  CPC ............ *H01L 2224/32225* (2013.01); *H01L 2224/45124* (2013.01); *H01L 2224/48225* (2013.01); *H01L 2224/73265* (2013.01); *H01L 2924/10253* (2013.01); *H01L 2924/10272* (2013.01); *H01L 2924/12032* (2013.01); *H01L 2924/13055* (2013.01); *H01L 2924/14252* (2013.01)

(56) References Cited

U.S. PATENT DOCUMENTS

| | | | | |
|---|---|---|---|---|
| 9,196,510 | B2* | 11/2015 | Hohlfeld | H01L 21/563 |
| 9,305,910 | B2* | 4/2016 | Horio | H01L 25/18 |
| 9,490,200 | B2* | 11/2016 | Yoshihara | H01L 24/32 |
| 9,761,567 | B2* | 9/2017 | Hori | H01L 23/49805 |
| 9,899,328 | B2* | 2/2018 | Tamada | H02M 1/088 |
| 9,899,345 | B2* | 2/2018 | Fujino | H01L 23/48 |
| 2009/0116197 | A1* | 5/2009 | Funakoshi | H01L 21/4882 |
| | | | | 361/719 |
| 2013/0258736 | A1* | 10/2013 | Higuchi | H01L 25/072 |
| | | | | 363/131 |
| 2015/0173248 | A1* | 6/2015 | Zeng | H05K 7/1432 |
| | | | | 361/709 |
| 2015/0187689 | A1* | 7/2015 | Nashida | H01L 23/4334 |
| | | | | 257/774 |
| 2016/0294379 | A1* | 10/2016 | Hayashiguchi | H01L 25/072 |
| 2017/0154877 | A1* | 6/2017 | Tanimoto | H01L 25/072 |
| 2017/0170157 | A1* | 6/2017 | Masuda | H01L 25/18 |

* cited by examiner (a)

(b)

(a) E-E' cross section (b) F-F' cross section (a)

(b)

US 10,147,707 B2

SEMICONDUCTOR DEVICE

CROSS REFERENCE TO RELATED APPLICATION

This application claims the benefit of and priority to the Japanese Patent Application No. 2017-029088 filed on Feb. 20, 2017, the entire contents of which are incorporated herein by reference.

FIELD

Embodiments described herein relate generally to a semiconductor device.

BACKGROUND

A plurality of power semiconductor chips is mounted on a metal substrate interposing an insulating layer therebetween in a power semiconductor module. The power semiconductor chip includes IGBT (Insulated Gate Bipolar Transistor), MOSFET (Metal Oxide Field Effect Transistor), or a diode, for example.

It is desirable that an inductance of an inside of the power semiconductor module be reduced as an over-voltage may be generated during high speed switching when the inductance of the inside is large, and thereby, cause a breakdown of the power semiconductor module. The switching loss becomes large even when the power semiconductor chip is not switched at a high speed.

SUMMARY

In some embodiments according to one aspect, a semiconductor device includes a first metal layer, a second metal layer provided on a same plane as the first metal layer, a first terminal, a second terminal, and a third terminal. A first metal wiring layer is electrically connected to the first terminal. A second metal wiring layer is electrically connected to the second terminal and the second metal layer and disposed over the first metal wiring layer. A third metal wiring layer is electrically connected to the third terminal and the first metal layer. A first semiconductor chip is provided between the first metal wiring layer and the first metal layer and includes a first upper electrode electrically connected to the first metal wiring layer and a first lower electrode electrically connected to the first metal layer. A second semiconductor chip is provided between the third metal wiring layer and the second metal layer and includes a second upper electrode electrically connected to the third metal wiring layer and a second lower electrode electrically connected to the second metal layer.

DETAILED DESCRIPTION

Figure 1:
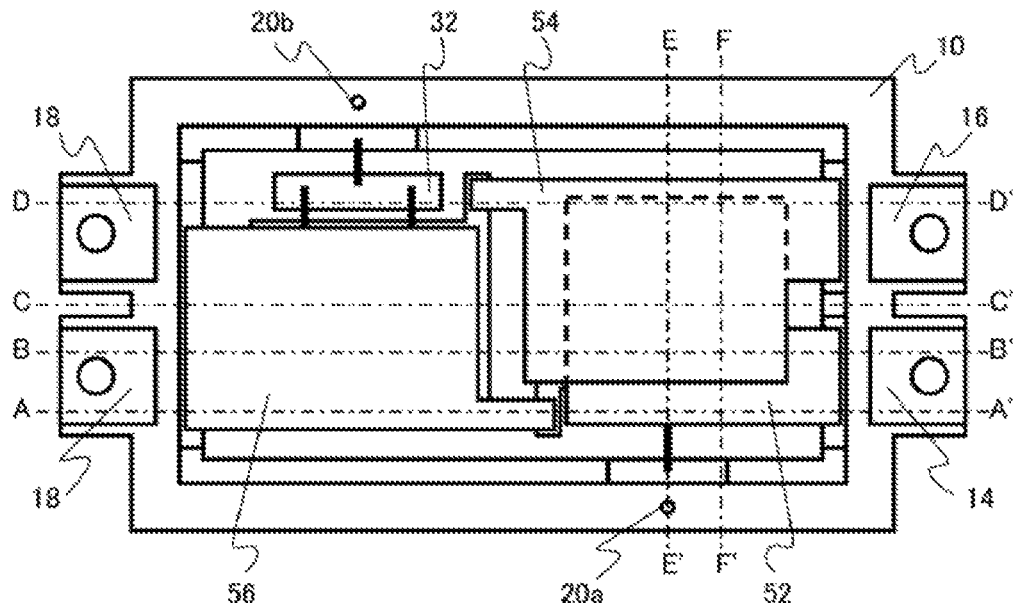
FIG. 1 is a schematic view of a semiconductor device according to a first embodiment.
Figure 1:
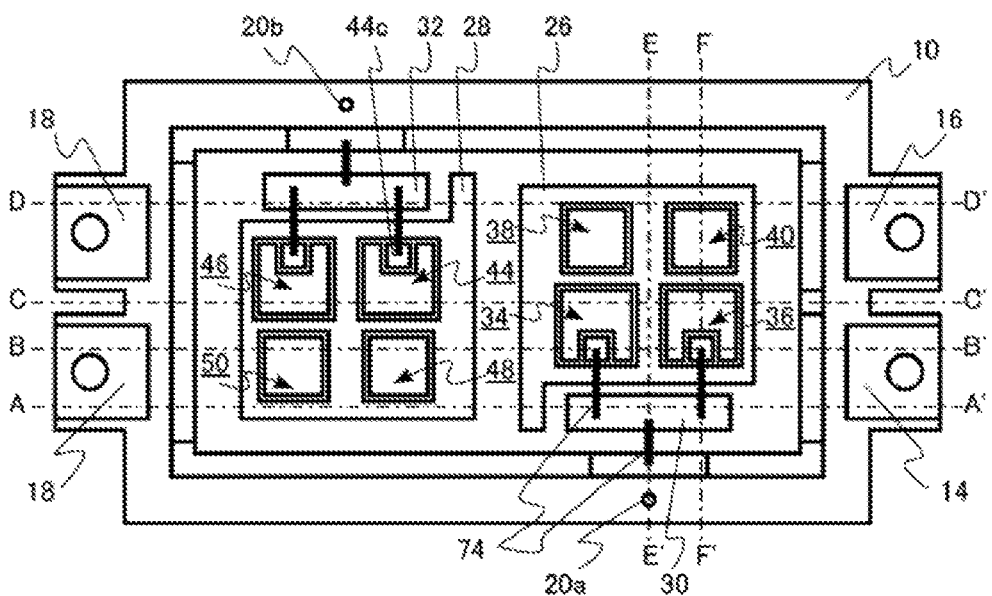

Embodiments provide a semiconductor device having a reduced inductance.

In this disclosure, corresponding (e.g., similar) elements and the like are given a same reference signs, and duplicate description thereof may not be presented.

In this disclosure, in order to represent positional relations of components and the like, an up direction as depicted in the drawings will be described as an "upper side", and a down direction as depicted in the drawings will be described as a "lower side". In this disclosure, the terms "upper side" and "lower side" are not necessarily terms representing relations with the direction of a gravitational force.

First Embodiment

In some embodiments according to one aspect, a semiconductor device includes a first metal layer, a second metal layer provided on a same plane as the first metal layer, a first terminal, a second terminal, and a third terminal. A first metal wiring layer is electrically connected to the first terminal. A second metal wiring layer is electrically connected to the second terminal and the second metal layer and disposed over the first metal wiring layer. A third metal wiring layer is electrically connected to the third terminal and the first metal layer. A first semiconductor chip is provided between the first metal wiring layer and the first metal layer and includes a first upper electrode electrically connected to the first metal wiring layer and a first lower electrode electrically connected to the first metal layer. A second semiconductor chip is provided between the third metal wiring layer and the second metal layer and includes a second upper electrode electrically connected to the third metal wiring layer and a second lower electrode electrically connected to the second metal layer.

Figure 2:
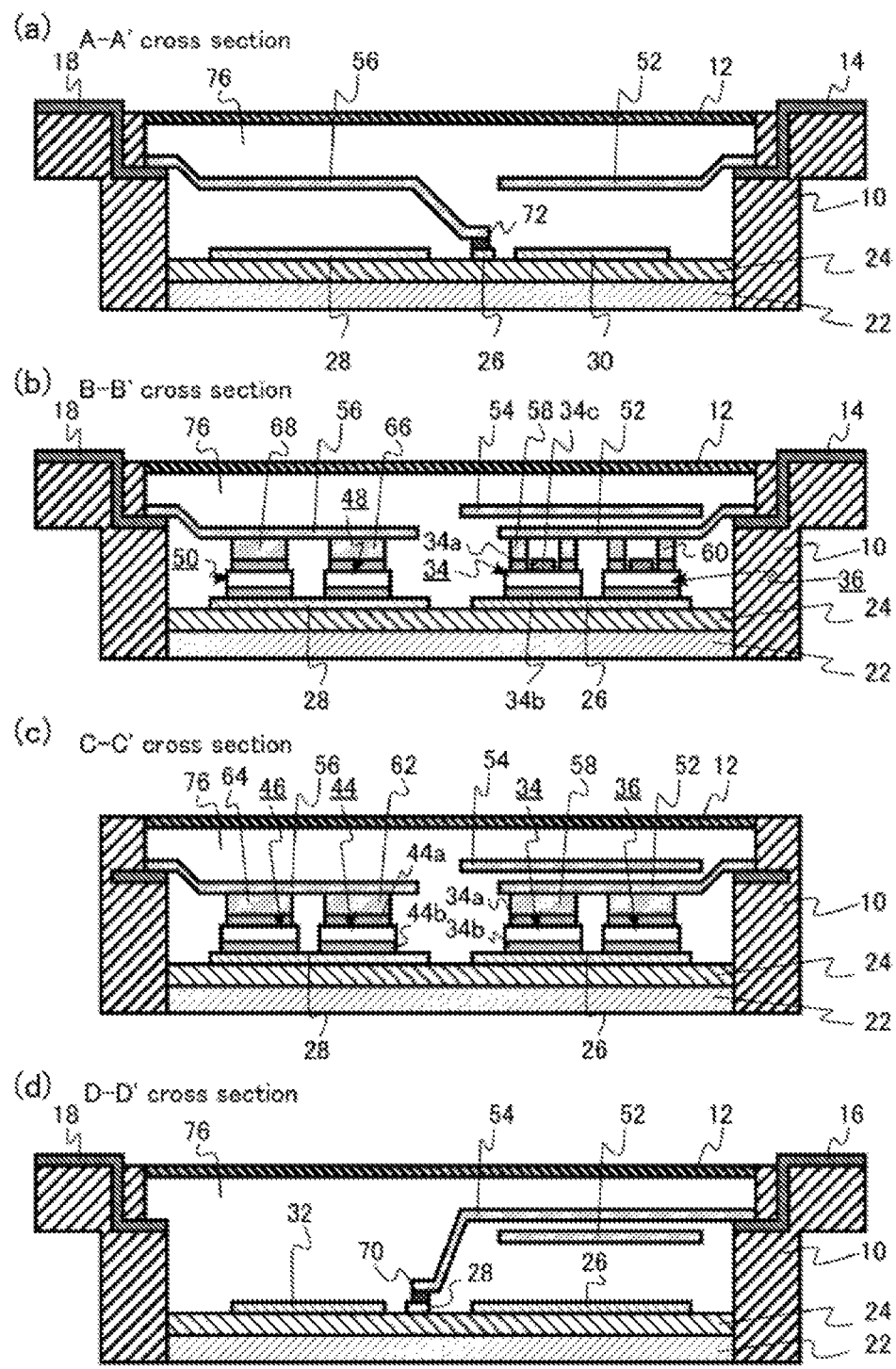
FIG. 2 is a schematic view of the semiconductor device according to the first embodiment.
Figure 3:
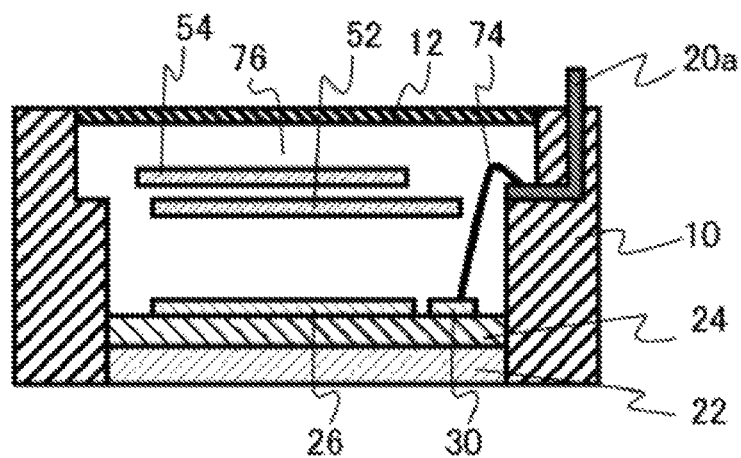
FIG. 3 is a schematic view of the semiconductor device according to the first embodiment.
Figure 3:
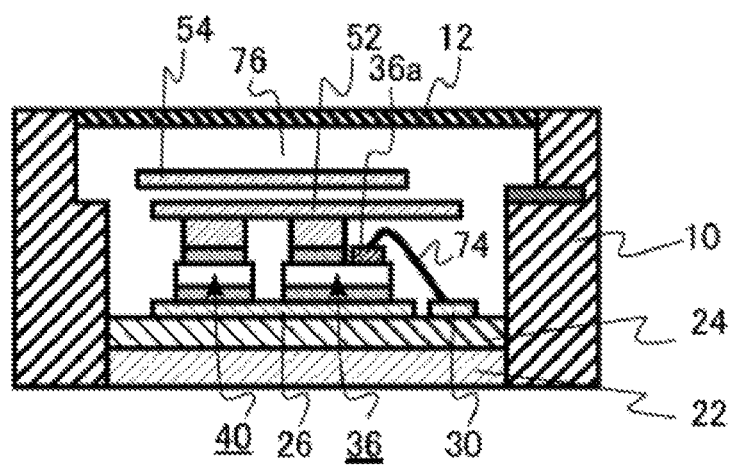
Figure 4:
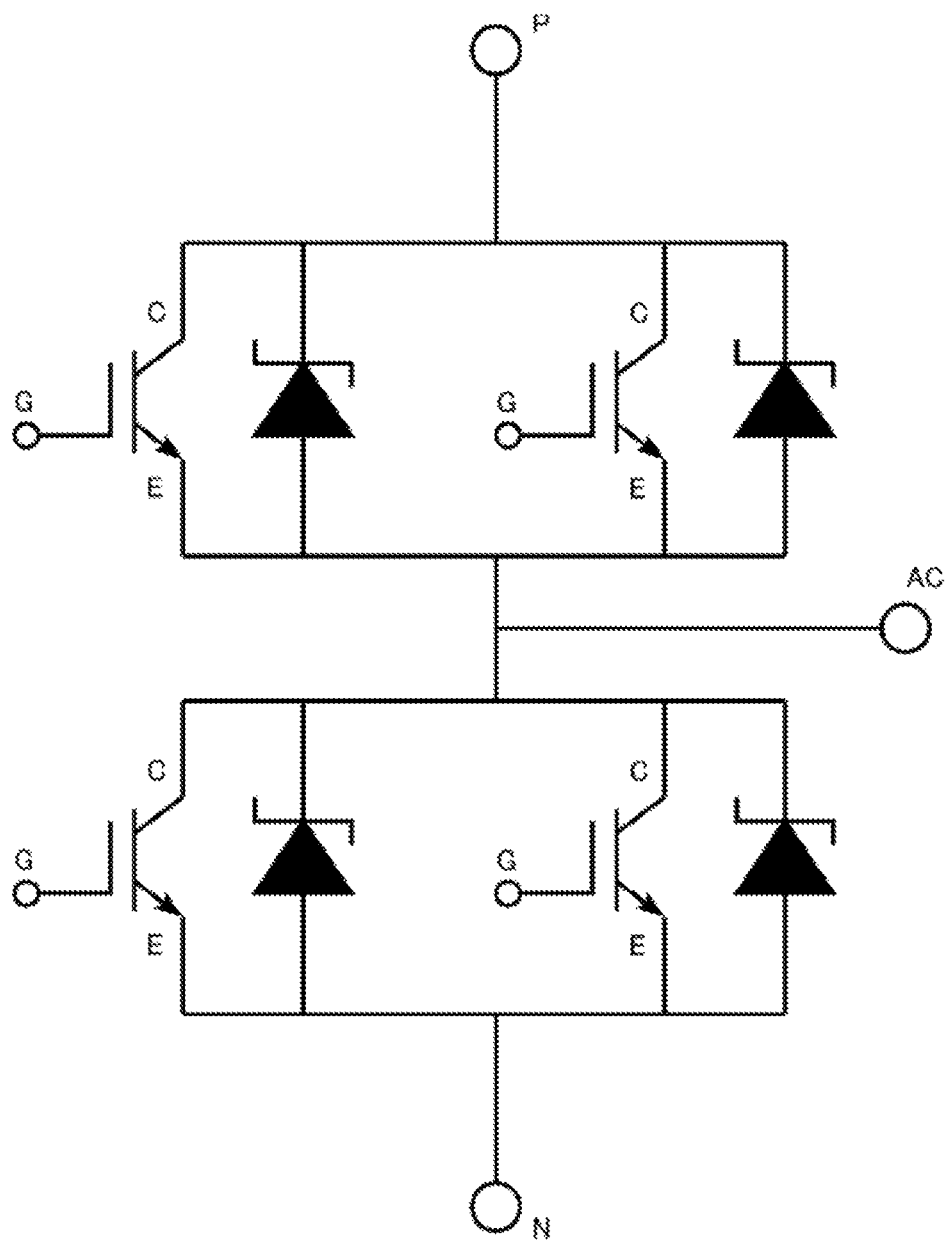
FIG. 4 is an equivalent circuit diagram of the semiconductor device according to the first embodiment.

FIGS. 1, 2, and 3 are schematic views of a semiconductor device according to a present embodiment. FIG. 1 shows a plane view, and FIG. 2 and FIG. 3 show cross-sectional views. FIG. 4 shows an equivalent circuit diagram.

The semiconductor device includes a power semiconductor module. In the power semiconductor module, two IGBT and two SBD (Schottky Barrier Diode) are connected in parallel with each other and are serially connected to two other IGBTs and two other SBDs, which are connected in parallel each other. The one power semiconductor module constitutes a half bridge circuit and is a so-called 2-in-1 type. Three power semiconductor modules can form a three-phase inverter circuit, for example.

The power semiconductor module includes a resin case 10, a lid 12, an N electric power terminal 14 (a first terminal), a P electric power terminal 16 (a second terminal), an AC output terminal 18 (a third terminal), a gate terminal 20a (a first gate terminal), a gate terminal 20b (a second gate terminal), a metal substrate 22, a resin insulating layer 24, a first metal layer 26, a second metal layer 28, a gate metal layer 30, a gate metal layer 32, IGBT 34 (a first semiconductor chip), IGBT 36, SBD 38, SBD 40, IGBT 44 (a second semiconductor chip), IGBT 46, SBD 48, SBD 50, a N-type metal wiring layer 52 (a first metal wiring layer), a P-type metal wiring layer 54 (a second metal wiring layer), a AC (third) metal wiring layer 56 (a third metal wiring layer), a metal plug 58, (a first connection portion), a metal plug 60, a metal plug 62 (a second connection portion), a metal plug 64, a metal plug 66, a metal plug 68, a solder layer 70 (a first adhesive layer), a solder layer 72 (a second adhesive layer), a bonding wire 74, and silicone gel 76.

FIG. 1 (*a*) is an upper plane view in which the lid 12 and the silicone gel 76 are removed from the semiconductor module. FIG. 1 (*b*) is an upper plane view in which the lid 12, the N-type (first) metal wiring layer 52, the P-type (second) metal wiring layer 54, the AC (third) metal wiring layer 56, and the silicone gel 76 are removed from the semiconductor module.

FIG. 2 (*a*) is a cross-sectional view taken along line A-A' depicted in FIG. 1(*a*) and FIG. 1(*b*). FIG. 2(*b*) is a cross-sectional view taken along line B-B' depicted in FIG. 1(*a*) and FIG. 1(*b*). FIG. 2(*c*) is a cross-sectional view taken along line C-C' depicted in FIG. 1(*a*) and FIG. 1(*b*). FIG. 2(*d*) is a cross-sectional view taken along line D-D' depicted in FIG. 1(*a*) and FIG. 1(*b*). FIG. 3 (*a*) is a cross-sectional view taken along line E-E' depicted in FIG. 1 (*a*) and FIG. 1 (*b*). FIG. 3(*b*) is a cross-sectional view taken along line F-F' depicted in FIG. 1(*a*) and FIG. 1(*b*).

The metal substrate 22 may include copper, for example. A back surface of the metal substrate 22 is connected to a heat dissipating plate (not shown in the figures) when the semiconductor module is mounted on a product.

The resin case 10 is provided so as to surround the metal substrate 22. The lid 12 is provided on the resin case 10. The silicone gel 76 is filled as a sealing material in the inside of the semiconductor module. The resin case 10, the metal substrate 22, the lid 12, and the silicone gel 76 can be provided to protect or insulate members of the inside of the semiconductor module.

The N electric power terminal 14, the P electric power terminal 16, the AC output terminal 18, the gate terminal 20*a*, and the gate terminal 20*b* are provided on the resin case 10. A positive voltage is applied to the P electric power terminal 16 from the outside, and a negative voltage is applied to the N electric power terminal 14 from the outside.

The resin insulating layer 24 is provided on the metal substrate 22 and insulates the first metal layer 26 and the second metal layer 28 from the metal substrate 22. The resin insulating layer 24 includes filler which is formed by boron nitride and the like and has a high heat transfer rate.

The first metal layer 26 and the second metal layer 28 are provided on the resin insulating layer 24 and provided on substantially the same plane.

The first metal layer 26 and the second metal layer 28 include, for example, copper and electrically connect to the semiconductor chips provided thereon.

The gate metal layer 30 and the gate metal layer 32 are provided on the resin insulating layer 24 and connect the semiconductor chip to the gate terminal 20*a* and the gate terminal 20*b*. The first metal layer 26, the second metal layer 28, gate metal layer 30, and the gate metal layer 32 are provided on substantially the same plane.

IGBT 34, IGBT 36, SBD 38, and SBD 40 are provided on the first metal layer 26, and provided between the N-type (first) metal wiring layer 52 and the first metal layer 26. IGBT 34, IGBT 36, SBD 38, and SBD 40 are connected to the first metal layer 26 via the solder or Ag (silver) nano-particles.

IGBT 34 includes an emitter electrode 34*a* (a first upper electrode) and a gate electrode 34*c* (a first gate electrode) provided on the upper surface and a collector electrode 34*b* (a first lower electrode). The emitter electrode 34*a* is electrically connected to the N-type (first) metal wiring layer 52.

The collector electrode 34*b* is electrically connected to the first metal layer 26. The gate electrode 34*c* is connected to the gate terminal 20*a* using the gate metal layer 30 and the bonding wire 74, for example, an aluminum wire.

IGBT 44, IGBT 46, SBD 48, and SBD 50 are provided on the second metal layer 28 and provided between the AC (third) metal wiring layer 56 and the second metal layer 28. IGBT 44, IGBT 46, SBD 48, and SBD 50 are connected to the second metal layer 28 via the solder or the Ag (silver) nano-particles.

IGBT 44 includes an emitter electrode 44*a* (a second upper electrode) and a gate electrode 44*c* (a second gate electrode) provided on the upper surface and a collector electrode 44*b* (a second lower electrode). The emitter electrode 44*a* is electrically connected to the AC (third) metal wiring layer 56. The collector electrode 44*b* is electrically connected to the second metal layer 28. The gate electrode 44*c* is connected to the gate terminal 20*b* using the gate metal layer 32 and the bonding wire.

IGBT 34, IGBT 36, SBD 38, SBD 40, IGBT 44, IGBT 46, SBD 48, and SBD 50 are semiconductor chips which include silicon carbonate (SiC) or silicon (Si).

The N-type (first) metal wiring layer 52 is provided on IGBT 34, IGBT 36, SBD 38, and SBD 40. The N-type (first) metal wiring layer 52 is electrically connected the N electric power terminal 14, for example, by an ultrasonic wave connection.

The N-type (first) metal wiring layer 52 includes a copper material with thick thickness which is 100 μm (micro meter) or more and 500 μm or less, for example.

The metal plug 58 is provided between the N-type (first) metal wiring layer 52 and IGBT 34 and between the N-type (first) metal wiring layer 52 and the emitter electrode 34*a*. The metal plug 58 electrically connects the N-type (first) metal wiring layer 52 and the emitter electrode 34*a*. The metal plug 58 is connected to the emitter electrode 34*a* via the solder or the Ag (silver) nano-particles.

Similarly the metal plug 60 is provided between the N-type (first) metal wiring layer 52 and IGBT 36. The metal plug 58 and the metal plug 60 include copper, for example.

The P-type (second) metal wiring layer 54 is provided on the N-type (first) metal wiring layer 52 which is provided between the P-type (second) metal wiring layer 54 and the first metal layer 26. The N-type (first) metal wiring layer 52 is provided between the P-type (second) metal wiring layer 54 and each of IGBT 34, IGBT 36, SBD 38, and SBD 40. The N-type (first) metal wiring layer 52 and the P-type (second) metal wiring layer 54 are substantially parallel.

The P-type (second) metal wiring layer 54 is electrically connected to the P electric power terminal 16 and the second metal layer 28. The P-type (second) metal wiring layer 54 is connected to the electric power terminal 16 by the ultrasonic wave connection. The P-type (second) metal wiring layer 54 is connected to the second metal layer 28 via the solder layer 70. The P-type (second) metal wiring layer 54 may be directly connected to the second metal layer 28 by the ultrasonic wave connection.

The P-type (second) metal wiring layer 54 includes, for example, copper material with thick thickness of 100 μm or more and 500 μm or less.

The AC (third) metal wiring layer 56 is provided on IGBT 44, IGBT 46, SBD 48, and SBD 50 and electrically connected to the AC output terminal 18 and the first metal layer 26. The AC (third) metal wiring layer 56 is connected to the AC output terminal 18 by the ultrasonic wave connection, for example. The AC (third) metal wiring layer 56 may be connected to the first metal layer 26 via the solder layer 72 or directly connected to the first metal layer 26 by the ultrasonic wave connection.

The AC (third) metal wiring layer 56 includes, for example, copper material with thick thickness of 100 μm or more and 500 μm or less.

The metal plug 62 is provided between the AC (third) metal wiring layer 56 and IGBT 44 and between the AC (third) metal wiring layer 56 and the emitter electrode 44a. The metal plug 62 is connected to the emitter electrode 44a via the solder or the silver nano-particles.

Similarly, the metal plug 64 is provided between the AC (third) metal wiring layer 56 and IGBT 46. The metal plug 62 and the metal plug 64 include copper, for example.

Next, an operation and an effect of the semiconductor device in the present embodiment is described.

Figure 5:
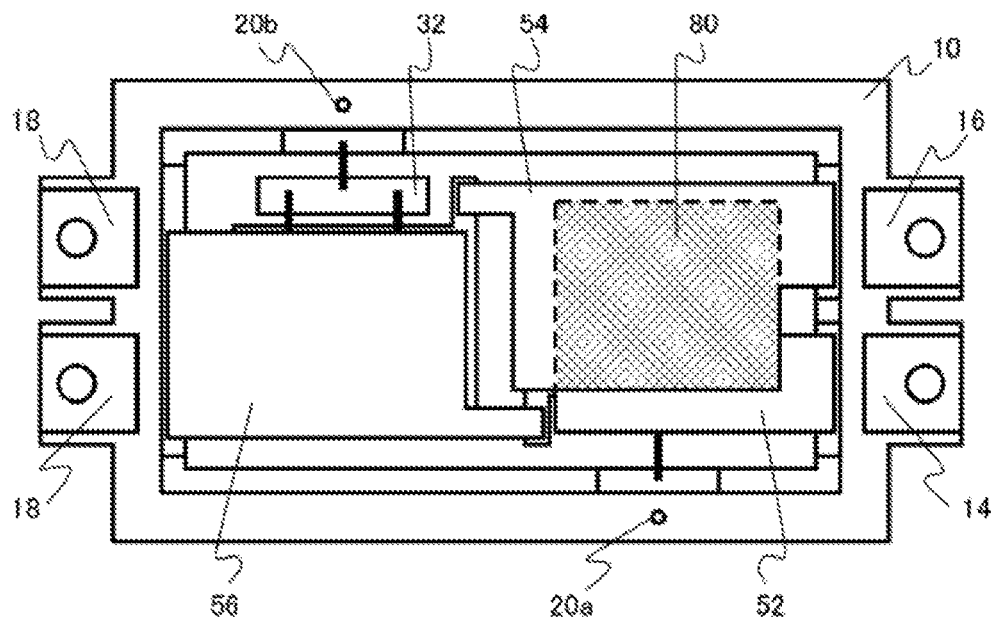
FIG. 5 is a view depicting an operation and an effect of the semiconductor device according to the first embodiment.

FIG. 5 is a view depicting an operation and an effect of the semiconductor device according to the embodiment and a plane view in a condition which the lid 12 and the silicone gel 76 are removed from the semiconductor module.

It is desirable that an inductance of the inside of the power semiconductor module be decreased. Over-voltage may occur in the high speed switching when the inductance of the inside is large and the occurrence of over-voltage may lead the power semiconductor module to breakdown Therefore, high speed switching of the power semiconductor chip cannot be performed due to increased switching losses.

The semiconductor module in the embodiment includes a parallel plate region 80 in which the N-type (first) metal wiring layer 52 and the P-type (second) metal wiring layer 54 are vertically overlapped, and the parallel plate region 80 is represented by a hatched region in FIG. 5.

A current flows in a reverse direction in the parallel plate region 80 and the inductance is cancelled between the N-type (first) metal wiring layer 52 and the P-type (second) metal wiring layer 54 That is, the inductance of the inside of the semiconductor module is reduced allowing switching at high speed and reduced switching losses.

Specifically, the inductance can be reduced to be 10 nH (nano henry) or less, while the inductance is about 20 nH without the parallel plate region 80.

The semiconductor module operates effectively when the semiconductor chip including silicon carbonate, which is capable of switching at the higher speed compared to the semiconductor chip including silicon, is used.

Also, a space for the wire bonding or a space for a leading wiring is needed on the resin insulating layer 24 when the semiconductor chip is mounted on the first metal layer 26 and the second metal layer 28, and the terminals and the semiconductor chips are electrically connected to each other using the wire bonding. Therefore, a space for mounting the semiconductor chip on the resin insulating layer 24 becomes small.

The semiconductor module in the embodiment electrically connects the terminals to the semiconductor chips using the first metal layer 26 and the second metal layer 28 and in addition, using the N-type (first) metal wiring layer 52, the P-type (second) metal wiring layer 54 and the AC (third) metal wiring layer 56 which are arranged on different surfaces from the first metal layer 26 and the second metal layer 28. Therefore, the space for the wire bonding or the space for a leading wiring is not needed on the resin insulating layer 24, as compared with the case in which the terminals and the semiconductor chips are electrically connected to each other using only bonding wire, the first metal layer 26, and the second metal layer 28 in which case, the space for mounting the semiconductor chip on the resin insulating layer 24 can become large.

Therefore, the plurality of semiconductor chips or the semiconductor chip having a large size can be mounted on the resin insulating layer 24, thus enhancing the flexibility of the design of the semiconductor module.

For example, the rated current can be easily increased without changing the size of the semiconductor module by mounting the plurality of semiconductor chips or mounting the semiconductor chip of the large size. Also, the cost of the semiconductor module for manufacturing can be reduced by mounting the plurality of semiconductor chips having a small size which have a low cost due to a high yield, instead of the semiconductor chip having a large size.

Additionally, breakdown or meltdown of the bonding wire may occur when the terminals and the semiconductor chips are electrically connected from each other using the bonding wire. Hereinafter, the case in which the bonding wire includes aluminum is described.

The semiconductor chip is heated when the semiconductor chip such as IGBT or SBD is energized, thereby, a stress derived from a difference of a linear expansion coefficient in the connection portion between the aluminum wire and the semiconductor chip may occur. Due to this stress, a coarsening or a crack of crystal particles (grain) of the aluminum wire may occur, until finally, the aluminum wire is broken down by the crack thus causing an open failure.

The aluminum wire is bonded to only a limited portion on the electrode of the semiconductor chip to hardly disperse the current of the inside of the electrode. Therefore, the current is concentrated to the connection portion between the semiconductor chip and the aluminum wire to have a tendency to rise in a temperature of the connection portion. The aluminum wire is easy to crack.

Furthermore, an area which the bonding wire occupies on the electrode of the semiconductor chip or the metal layer, which the semiconductor chip is mounted thereon, is limited. Therefore, the number of aluminum wires available to handle an increase in current load per aluminum wire is limited. In addition, aluminum wire is easy to melt.

Heat and a stress are alternately applied to the aluminum wire as the semiconductor module is alternately energized and interrupted. As a result, the aluminum wire breaks down or melts, thus becoming unreliable.

Bonding wire is not used for the connection in the semiconductor module in the embodiment except for the connection between the semiconductor chip and each of the gate terminal 20a and 20b. Therefore, unreliability derived from the bonding wire can be reduced.

The connection portion between the electrode of the semiconductor chip and each of the N electric power terminal 14 and the AC output terminal 18 is not a point contact such as the bonding wire, but a surface contact which has a large contact area. Therefore, the current is not easily concentrated and the temperature rise is less, thus improving the reliability for the connection.

Also, the thick metal material, for example, copper material is used for the N-type (first) metal wiring layer 52, the P-type (second) metal wiring layer 54, and the AC (third) metal wiring layer 56 improves the heat dispersion property compared with a case using the bonding wire.

in the semiconductor module in the embodiment, the inductance is capable of being reduced by using the N-type (first) metal wiring layer 52 and the P-type (second) metal wiring layer 54 which configure the parallel plate region 80. Therefore, the semiconductor module can be switched at high speed and the switching loss can be reduced. Also, limited used of the bonding wire for the connection to reduces the unreliability derived from the bonding wire and improves the heat dispersion property.

Second Embodiment

A semiconductor device in a second embodiment is similar to that of the first embodiment except that the first metal wiring and the second metal wiring are placed inside the resin substrate. Therefore, a part described in the first embodiment is not described in the second embodiment.

Figure 6:
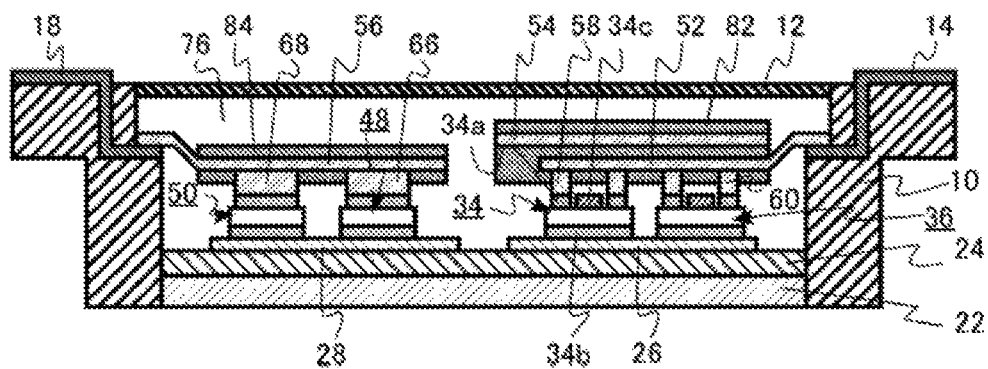
FIG. 6 is a schematic view of the semiconductor device according to a second embodiment.

FIG. 6 is a schematic view of the semiconductor device according to a second embodiment and a cross-sectional view corresponding to the cross-sectional view taken along BB' direction depicted in FIG. 2(b).

At least a portion of the N-type (first) metal wiring layer 52 and the P-type (second) metal wiring layer 54 is embedded into the same resin substrate 82, and furthermore, a portion of the metal plug 58 and a portion of the metal plug 60 are embedded as well. The resin substrate 82 may be multilayer wiring substrate.

Also, at least a portion of the AC (third) metal wiring layer 56 is embedded into a resin substrate 84, and furthermore, a portion of the metal plug 66 and a portion of the metal plug 68 are embedded as well.

The resin substrate 82 and 84 may include glass epoxy resin.

The N-type (first) metal wiring layer 52 and the P-type (second) metal wiring layer 54 are integrated in the resin substrate 84 to easily assemble the semiconductor module.

A difference of the linear expansion coefficient between the metal substrate 22 and the resin substrate 84 can be made small to reduce an occurrence of a stress due to heat. Therefore, the reliability for the connection portion between the metal layer and the semiconductor chip or between the metal wiring layer and the semiconductor chip can be improved.

An insulating property between the N-type (first) metal wiring layer 52 and the P-type (second) metal wiring layer 54 which are embedded in the resin substrate 82 can be tested before assembling the semiconductor module. Therefore, the reliability of the insulating property of the semiconductor module can be improved.

Thus, the semiconductor module according to the present embodiment can obtain an effect similar to the first embodiment, can be easily assembled, and has greater reliability.

Third Embodiment

A semiconductor device in a third embodiment is similar to that of the first embodiment except that a gate wiring layer which connects the gate electrode of the semiconductor chip and the gate terminal is further included. Therefore, the part described in the first embodiment will not describe in the third embodiment.

Figure 7:
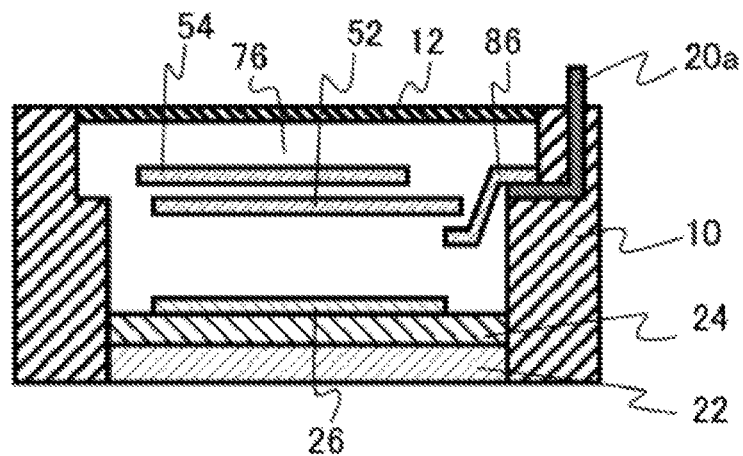
FIG. 7 is a schematic view of the semiconductor device according to a third embodiment.
Figure 7:
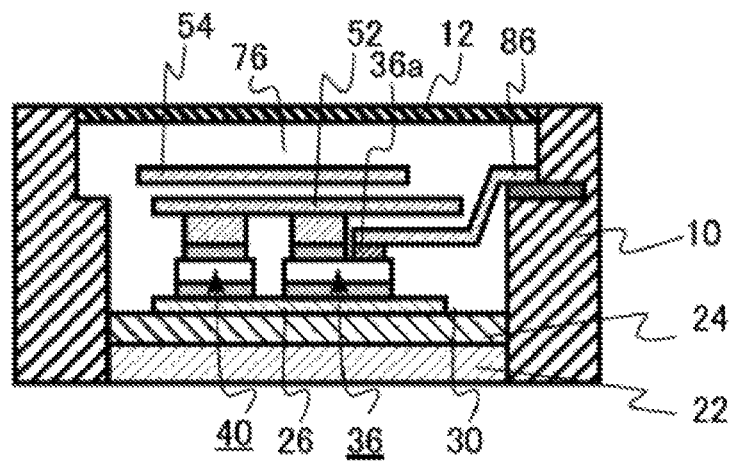

FIG. 7 is a schematic view of the semiconductor device according to the third embodiment. FIG. 7 (a) is a cross-sectional view corresponding to the cross-sectional view taken along EE' direction depicted in FIG. 3(a) and FIG. 7(b) is a cross-sectional view corresponding to the cross-sectional view taken along FF' direction depicted in FIG. 3(b).

A gate wiring layer 86 electrically and directly connects the gate electrode 34c on the upper surface of IGBT 36 and the gate terminal 20a.

The gate wiring layer 86 is connected to the gate electrode 34c using the solder and connected to the gate terminal 20a by ultrasonic wave connection.

The gate wiring layer 86 includes copper material, for example, and may be included in the resin substrate 82 described in the second embodiment.

Also, a gate resistor may be included in the resin substrate 82 in addition to the gate wiring layer 86.

The gate metal layer 30 and the gate metal layer 32 provided on the resin substrate 24 need not enlarge the space for mounting of the semiconductor chip. Therefore, the flexibility of the design of the semiconductor module can be further increased.

The semiconductor module according to the present embodiment has a similar effect as the first embodiment and further increases the flexibility of the design.

Fourth Embodiment

A semiconductor device according to a fourth embodiment is similar to that of the second embodiment except for having a back surface metal layer and a ceramic substrate. Therefore, the part described in the second embodiment is described in the fourth embodiment.

Figure 8:
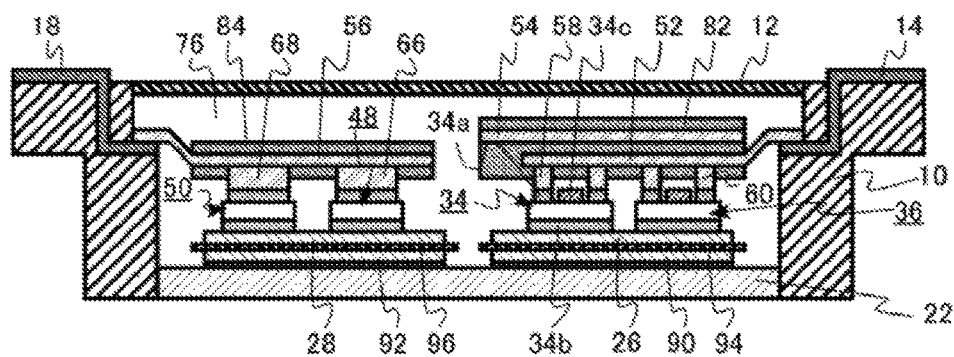
FIG. 8 is a schematic view of the semiconductor device according to a fourth embodiment.

FIG. 8 is a schematic view of the semiconductor device according to the fourth embodiment and a cross-sectional view corresponding to the cross-sectional view taken along BB' direction depicted in FIG. 2(b).

The semiconductor module according to the fourth embodiment includes a back surface metal layer 90, a back surface metal layer 92, a ceramic substrate 94, and a ceramic substrate 96 instead of the resin insulating layer 24 according to the second embodiment.

The ceramic substrate 94 is provided between the back surface metal layer 90 and the first metal layer 26, and the ceramic substrate 96 is provided between the back surface metal layer 92 and the second metal layer 28.

The ceramic substrate 94 and the ceramic substrate 96 may include aluminum substrate. The back surface metal layer 90 and the back surface metal layer 92 may include copper.

The heat dissipation property and the insulation property can be improved by using the back surface metal layer 90, the back surface metal layer 92, the ceramic substrate 94, and the ceramic substrate 96 instead of the resin insulating layer 24.

The semiconductor module according to the present embodiment has a similar effect as the second embodiment, and thus improves the heat dissipation property and the insulation property.

From the first to the fourth embodiments, two IGBT and two SBD are mounted on the first metal layer 26 and the second metal layer 28, respectively, but the number of IGBTs and SBDs which are mounted thereon is not limited.

From the first to the fourth embodiments, IGBT and SBD are used as a semiconductor chip, but the other transistors or diodes, for example, MOSFET or a PIN diode etc. may be used. Also, only MOSFET may be mounted.

From the first to the fourth embodiments, silicone gel 76 is used as a sealing material, but the other resin materials, for example, epoxy resin may be used instead of silicone gel 76.

While certain embodiments have been described, these embodiments have been presented by way of example only, and are not intended to limit the scope of the disclosure. Indeed, the methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A semiconductor device comprising:
   a first metal layer;
   a second metal layer provided on a same plane as the first metal layer;
   a first terminal;
   a second terminal;
   a third terminal;
   a first metal wiring layer electrically connected to the first terminal;
   a second metal wiring layer electrically connected to the second terminal and the second metal layer, and disposed over the first metal wiring layer;
   a third metal wiring layer electrically connected to the third terminal and the first metal layer;
   a first semiconductor chip provided between the first metal wiring layer and the first metal layer and including a first upper electrode electrically connected to the first metal wiring layer and a first lower electrode electrically connected to the first metal layer; and
   a second semiconductor chip provided between the third metal wiring layer and the second metal layer and including a second upper electrode electrically connected to the third metal wiring layer and a second lower electrode electrically connected to the second metal layer.

2. The semiconductor device according to claim 1, further comprising:
   a first gate terminal; and
   a second gate terminal, wherein
   the first semiconductor chip comprises a first gate electrode electrically connected to the first gate terminal and the second semiconductor chip comprises a second gate electrode electrically connected to the second gate terminal.

3. The semiconductor device according to claim 1, wherein
   the first metal wiring layer and the second metal wiring layer are arranged in parallel.

4. The semiconductor device according to claim 1, wherein
   the first metal wiring layer is interposed between the first semiconductor chip and the second metal wiring layer.

5. The semiconductor device according to claim 1, further comprising:
   a first connection portion comprising a metal and provided between the first metal wiring layer and the first upper electrode; and
   a second connection portion comprising a metal and provided between the third metal wiring layer and the second upper electrode.

6. The semiconductor device according to claim 1, wherein
   the second metal wiring layer and the second metal layer are directly connected or connected via an adhesive layer therebetween and the third metal wiring layer and the first metal layer are directly connected or connected via an adhesive layer therebetween.

7. The semiconductor device according to claim 1, wherein
   the first metal wiring layer and the second metal wiring layer are provided in a resin substrate.

8. A semiconductor device comprising:
   a first metal wiring layer connected to a first terminal;
   a first metal layer;
   a first semiconductor chip disposed between the first metal wiring layer and the first metal layer;
   a second metal wiring layer disposed over the first metal wiring layer, connected to a second terminal and interacting with the first metal wiring layer to reduce inductance of the semiconductor device;
   a third metal wiring layer connected to a third terminal;
   a second metal layer; and
   a second semiconductor chip disposed between the second metal layer and the third metal wiring layer,
   wherein the first metal layer is electrically connected to the third metal wiring layer and the second metal layer is electrically connected to the second metal wiring layer and wherein the first and second metal layers are disposed in the same plane.

9. The semiconductor device according to claim 8, wherein the first metal wiring layer and the second metal wiring layer are arranged in parallel and overlap each other.

10. The semiconductor device according to claim 8, wherein the first metal wiring layer is interposed between the first semiconductor chip and the second metal wiring layer.

11. The semiconductor device according to claim 8, wherein the first metal wiring layer and the second metal wiring layer are embedded in a resin substrate.

12. The semiconductor device according to claim 8,
   further comprising first and second ceramic substrates and first and second back surface metal layers;
   wherein the first ceramic substrate is provided between the first back surface metal layer and the first metal layer; and
   wherein the second ceramic substrate is provided between the second back surface metal layer and the second metal layer.

13. The semiconductor device according to claim 8, wherein the first semiconductor chip includes a first upper electrode and a first lower electrode, the first upper electrode being electrically connected to the first metal wiring layer, the first lower electrode being electrically connected to the first metal layer.

14. The semiconductor device according to claim 8, wherein the second semiconductor chip includes a second upper electrode and a second lower electrode, the second upper electrode being electrically connected to the third metal wiring layer, the second lower electrode being electrically connected to the second metal layer.

15. The semiconductor device according to claim 8,
   further comprising a first gate terminal and a second gate terminal,
   wherein the first semiconductor chip includes a first gate electrode electrically connected to the first gate terminal and the second semiconductor chip includes a second gate electrode electrically connected to the second gate terminal.

16. A semiconductor device comprising:
   a first metal wiring layer connected to a first terminal;
   a first metal layer;
   a first gate terminal;
   a first semiconductor chip disposed between the first metal wiring layer and the first metal layer and including a first insulated gate bipolar transistor having a first gate electrode connected to the first gate terminal;
   a second metal wiring layer disposed over the first metal wiring layer, connected to a second terminal and interacting with the first metal wiring layer to reduce inductance of the semiconductor device;

a third metal wiring layer connected to a third terminal;

a second metal layer;

a second gate terminal; and a second semiconductor chip disposed between the second metal layer and the third metal wiring layer and including a second insulated gate bipolar transistor having a second gate electrode connected to the second gate terminal, wherein the first metal layer is electrically connected to the third metal wiring layer and the second metal layer is electrically connected to the second metal wiring layer and wherein the first and second metal layers are disposed in the same plane.

17. The semiconductor device according to claim 16, wherein a negative voltage is applied to the first terminal, a positive voltage is applied to the second terminal, gate voltages are applied to first and second gate terminals and an AC output voltage is available at the third terminal.

18. The semiconductor device according to claim 16, wherein the first insulated gate bipolar transistor has an emitter electrode connected to the first metal wiring layer and a collector electrode connected to the first metal layer and the second insulated gate bipolar transistor has an emitter electrode connected to the third metal wiring layer and a collector electrode connected to the second metal layer.

19. The semiconductor device according to claim 16, wherein the first metal wiring layer is interposed between the first semiconductor chip and the second metal wiring layer.

20. The semiconductor device according to claim 16, wherein the first metal wiring layer and the second metal wiring layer are arranged in parallel and overlap each other and interact capacitively.

* * * * *